(12) United States Patent
Micheloni et al.

(10) Patent No.: US 6,307,778 B1
(45) Date of Patent: Oct. 23, 2001

(54) NON VOLATILE MEMORY WITH DETECTION OF SHORT CIRCUITS BETWEEN WORD LINES

(75) Inventors: Rino Micheloni, Turate; Andrea Sacco, Alessandria; Sabina Mognoni, Cirimido, all of (IT)

(73) Assignee: STMicroelectronics S.r.L., Agrate Brianza (IT)

(*) Notice: Subject to any disclaimer, the term of this patent is extended or adjusted under 35 U.S.C. 154(b) by 0 days.

(21) Appl. No.: 09/658,236

(22) Filed: Sep. 8, 2000

(30) Foreign Application Priority Data

Sep. 10, 1999 (EP) .................................................. 99830567

(51) Int. Cl.$^7$ .................................................. G11C 16/06
(52) U.S. Cl. .............................. 365/185.09; 365/185.18; 365/185.2; 365/185.21
(58) Field of Search ................. 365/185.09, 185.18, 365/185.2, 185.21, 185.23, 189.07, 189.09

(56) References Cited

U.S. PATENT DOCUMENTS

| | | | |
|---|---|---|---|
| 5,331,594 | 7/1994 | Hotta | 365/201 |
| 5,659,550 | 8/1997 | Mehrotra et al. | 371/21.4 |
| 5,999,450 | * 12/1999 | Dallabora et al. | 365/185.09 |

FOREIGN PATENT DOCUMENTS

WO 97/37357   10/1997   (WO).

* cited by examiner

*Primary Examiner*—David Nelms
*Assistant Examiner*—David Lam
(74) *Attorney, Agent, or Firm*—Theodore E. Galanthay; Robert Iannucci; Seed IP Law Group, PLLC

(57) ABSTRACT

The non volatile memory device integrates, in one and the same chip, the array of memory cells, a voltage regulator which supplies a regulated operating voltage to a selected word line, and a short circuit detecting circuit. The short circuit detecting circuit detects the output voltage of the voltage regulator, which is correlated to the current for biasing the cells of the word line selected. Once settled to the steady state condition, the output current assumes one first value in the absence of short circuits, and one second value in the presence of a short circuit between the word line selected and one or more adjacent word lines. The short circuit detecting circuit compares the output current of the voltage regulator with a reference value and generates at output a short circuit digital signal which indicates the presence or otherwise of a short circuit.

18 Claims, 5 Drawing Sheets

NON VOLATILE MEMORY WITH DETECTION OF SHORT CIRCUITS BETWEEN WORD LINES

TECHNICAL FIELD

The present invention refers to a nonvolatile memory, in particular of the Flash EEPROM type.

BACKGROUND OF THE INVENTION

As is known, memories are comprised of memory arrays made up of a plurality of cells arranged in rows and columns.

Generally, the rows are referred to as "word lines", whilst the columns are referred to as "bit lines".

In the design of a memory of the Flash EEPROM type, which uses CMOS technology, it is necessary to take into consideration the aspects linked to the use of processes of fabrication that are not yet completely stabilized and, in certain cases, are even still undergoing study.

One of the most frequent problems arising from the use of these processes is that of the formation of short circuits between two or more adjacent word lines/bit lines.

More in particular, FIG. 1 shows a memory device 1 comprising a memory array 2 made up of cells 3, only some of which are shown in this figure.

Each memory cell 3 comprises a floating gate transistor having drain and source conduction terminals.

The cells 3 are arranged in a plurality of local word lines, designated by LWL0, LWL1, LWL2, LWL3, which are physically made up of strips of polysilicon (poly2), with all the gate terminals of the cells of any given word line being connected together.

In turn, each bit line, made by means of metallic conductive paths (metal 1), connects up together the drain terminals of the cells arranged in one and the same column, whilst the source terminals are connected to a source line common to all the cells.

Alongside a packet of local word lines there is provided a global word line MWL0 connected to an output node of a voltage regulator REG, which generates as output a regulated voltage Vr, and to a first decoder 18 of global word lines.

In FIG. 1, the memory device 1 uses a second decoder for addressing the local word lines LWL0, LWL1, LWL2, LWL3.

The second decoder is schematically represented by a plurality of inverters 4, one for each local word line LWL0, LWL1, LWL2, LWL3, each inverter being driven by an end decoder 5 and comprising a PMOS transistor M' which has its conduction terminals connected between a local word line, for example LWL0, and the global word line MWL0, and an NMOS transistor M" which has its conduction terminals connected between the local word line LWL0 and a ground terminal GND.

The inverters 4 are driven so that they activate, from among the transistors M', only the one corresponding to the local word line that it is intended to address (word line selected), whereas all the remaining local word lines are connected to ground by the turning on of the respective transistors M".

With the reduction of the pitch between adjacent word lines/bit lines due both to the reduction in the size of memory devices and to the evolution of the processes for their integration, there is an increasing likelihood of these lines coming into contact with each other, thus generating short circuits.

To overcome this problem, generally the so called "redundancy method" is used, which consists in providing extra bit lines/word lines for replacing any bit lines/word lines that may get damaged.

FIG. 2, in which each word line is represented by a distributed RC network, shows a few examples of short circuits that may occur between adjacent word lines.

More in particular, one first type of short circuit (non resistive) occurs when the inverters 4.1 and 4.2 (or 4.3 and 4.4) for two short circuited word lines LWL1 and LWL2 (or LWL3 and LWL4) are connected directly, as represented in FIG. 2 by the dashed line CORT1.

A second type of short circuit (resistive) occurs when an inverter 4.5 for a word line LWL5 is connected to the end of another word line LWL1, as represented in FIG. 2 by the dashed line CORT2. In this case, between the inverter 4.5 and ground a resistance Rw is present.

A third type of short circuit (resistive) occurs when the ends of two word lines LWL1 and LWL2 (or LWL3 and LWL4) are short circuited, as represented in FIG. 2 by the dashed line CORT3. In this case, between the inverter (for example 4.1 or 4.3) connected to the selected word line and ground a resistance 2Rw is present.

Currently, the check on the integrity of word lines is carried out in the stage of testing of the memory device and consists in performing a sophisticated algorithm which is implemented externally and is based upon a cross check on appropriate configurations of data written inside the cells 3.

The use of the above mentioned algorithm entails an increase both in the times and in the costs involved in the testing stage, in that it means that, in order to check the data configurations, it is necessary for the cells 3 to be first written, then read, and finally erased, once the presence or otherwise of short circuits has been verified.

Consequently, this known solution is complex, costly and involves a considerable amount of time.

SUMMARY OF THE INVENTION

The technical problem which led to the present invention was that of creating a memory device that would be free from the limitations and drawbacks referred to above with reference to the prior art.

The technical problem has been solved by means of a memory device as defined in claim 1.

BRIEF DESCRIPTION OF THE DRAWINGS

The characteristics and advantages of the memory device according to the invention will emerge from the ensuing description of an example of embodiment, which is given purely to provide a non limiting illustration, with reference to the attached drawings.

In these drawings.

DETAILED DESCRIPTION OF THE INVENTION

Figure 1:
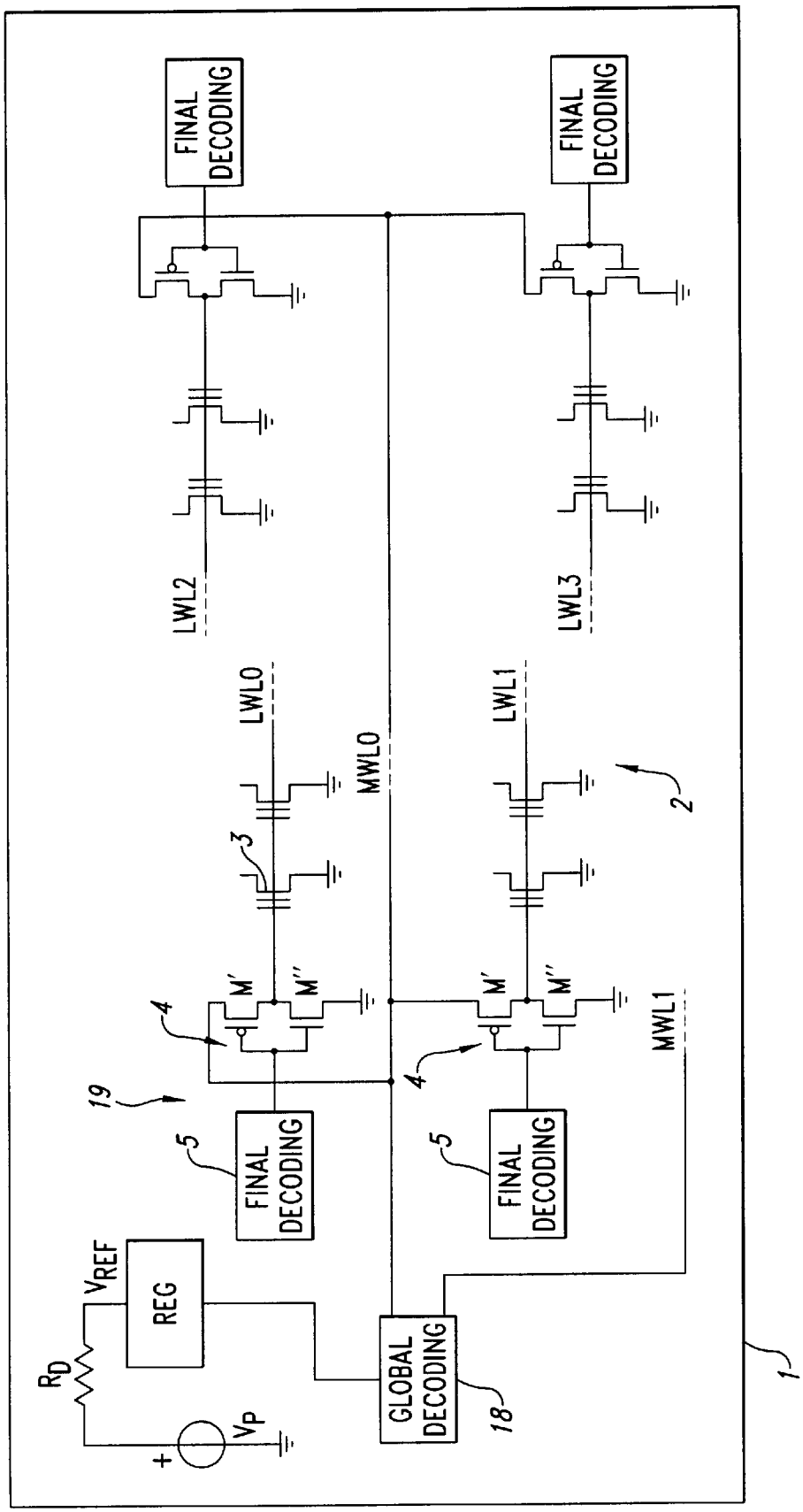
FIG. 1 presents the electrical diagram of a memory device made according to the known art.

The memory device 1 according to FIG. 3 has the structure already described with reference to FIG. 1;

consequently, the parts that are the same as those of FIG. 1 are designated by the same reference numbers and will not be described any further.

Figure 3:
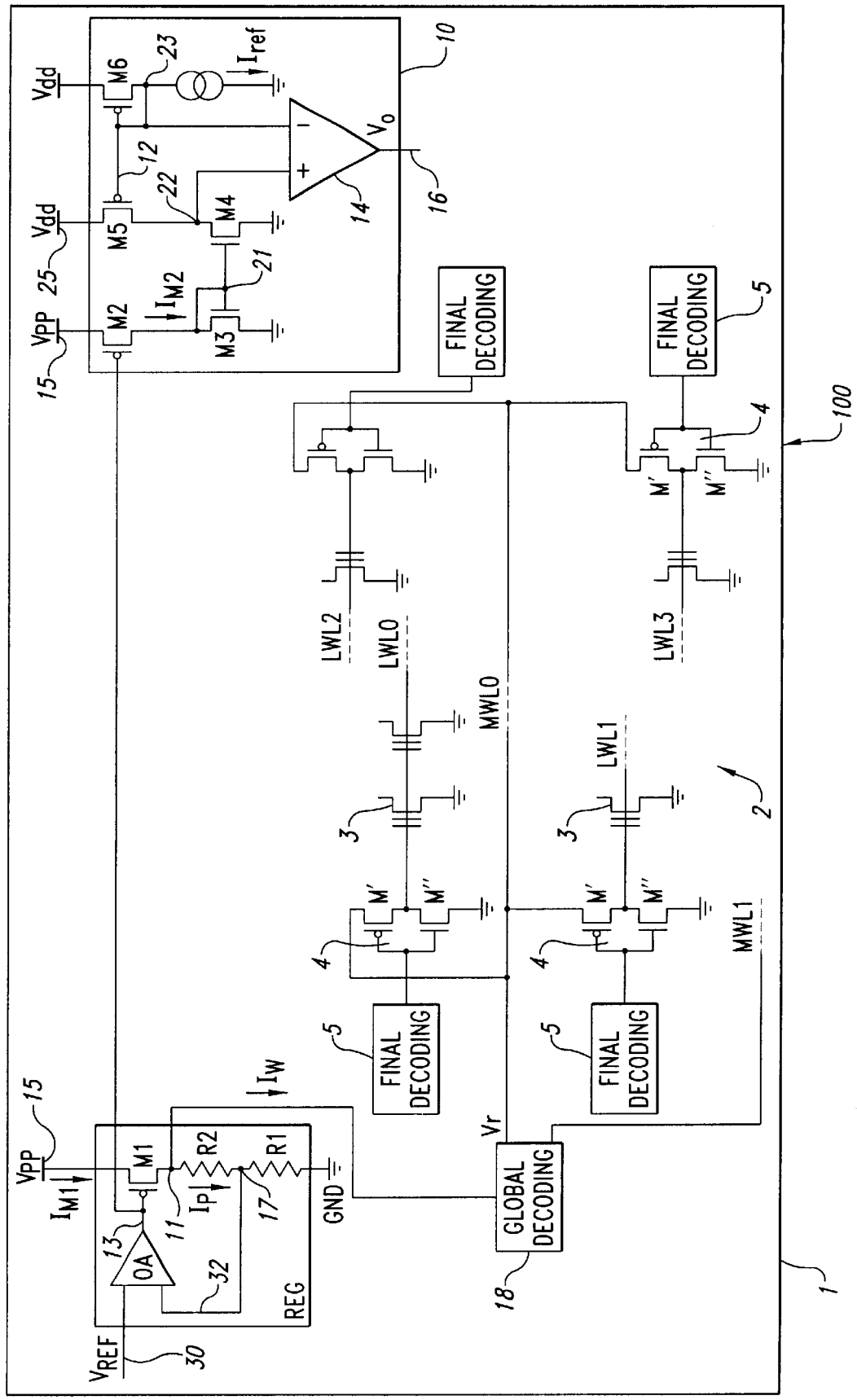
FIG. 3 illustrates the electrical diagram of a memory device made according to the present invention.

FIG. 3 shows the structure of the voltage regulator REG in greater detail, the regulator operating more in general as a voltage generator having an input terminal 30 that receives a reference voltage Vref and an output node 11 on which a regulated voltage Vr is present.

More in particular, the voltage regulator REG includes a differential amplifier OA having a first input terminal coinciding with the input terminal 30 of the voltage regulator REG, a second feedback input terminal 32, and an output terminal 13.

The second input terminal 32 of the amplifier OA is connected to an intermediate node 17 of a voltage divider, also belonging to the voltage regulator REG and made up of two resistors R1, R2, connected together in series. The voltage divider R1, R2 is connected between the ground line GND and the output node 11 of the voltage regulator REG.

In the voltage regulator REG there is also present a PMOS type output transistor M1 having a source terminal, a drain terminal and a gate terminal connected, respectively, to a first supply line 15 set at a voltage Vpp, to the output node 11 of the voltage regulator REG, and to the output terminal 13 of the operational amplifier OA.

The memory device 1 further comprises, integrated in the same chip 100, a detecting circuit 10 that detects short circuits between two or more adjacent word lines LWL0, LWL1, LWL2, LWL3. The detecting circuit 10 has an input terminal connected to the output terminal 13 of the operational amplifier OA, and an output terminal 16 on which there is present a digital signal Vo which indicates whether short circuits have or have not occurred.

The detecting circuit 10 also comprises a current sensor including a PMOS transistor M2 which has a gate terminal connected to the output terminal 13 of the operational amplifier OA, a source terminal connected to the first supply line 15, and a drain terminal connected to a first current mirror circuit 21.

The first current mirror circuit 21 is made up of two NMOS transistors M3, M4. In detail, the transistor M3 is diode connected (i.e., it has its drain and gate terminals short circuited) and has its drain terminal connected to the drain terminal of the transistor M2, its source terminal connected to the ground line GND, and its gate terminal connected to the gate terminal of the transistor M4. The latter has its source terminal connected to the ground line GND and its drain terminal connected to a first circuit node 22.

The detecting circuit 10 also comprises a second current mirror circuit 12 which constitutes a current to voltage converter and is made up of two PMOS transistors M5, M6. In detail, the transistor M6 is diode connected (i.e., it has its drain and gate terminals short circuited) and has its drain terminal connected to a second circuit node 23, which is in turn connected to a terminal of a generator generating a reference current Iref The transistor M6 further has its source terminal connected to a second supply line 25 set at a voltage Vdd and its gate terminal connected to the gate terminal of the transistor M5. The latter has its source terminal connected to the second supply line 25 and its drain terminal connected to the first circuit node 22.

Finally, the detecting circuit 10 comprises a comparison element 14 which includes a voltage comparator circuit having an inverting input terminal and a non inverting input terminal connected, respectively, to the first circuit node 22 and to the second circuit node 23, and an output terminal defining the output terminal 16 of the detecting circuit 10.

The operation of the memory device 1 is as follows:

In the reading or programming phase, the voltage applied to the gate terminal of the cell 3 selected is preset and regulated by means of the voltage regulator REG. Assume, for example, that the word line selected is LWL0. Initially, after application of the regulated voltage Vr, the output transistor M1 of the voltage regulator REG is traversed by a current IM1 equal to the sum of two separate currents: one constant current Ip due to the voltage divider R1, R2, and one dynamic current Iw due to the charge of the word line selected LWL0. Subsequently, the charge transient of the selected word line LWL0, in the case where the latter is isolated and not short circuited with other word lines, disappears in a time that depends upon the time constant RC associated to the row, bringing the current Iw to a zero value in that the decoding structure used for addressing is of the CMOS type.

Figure 2:
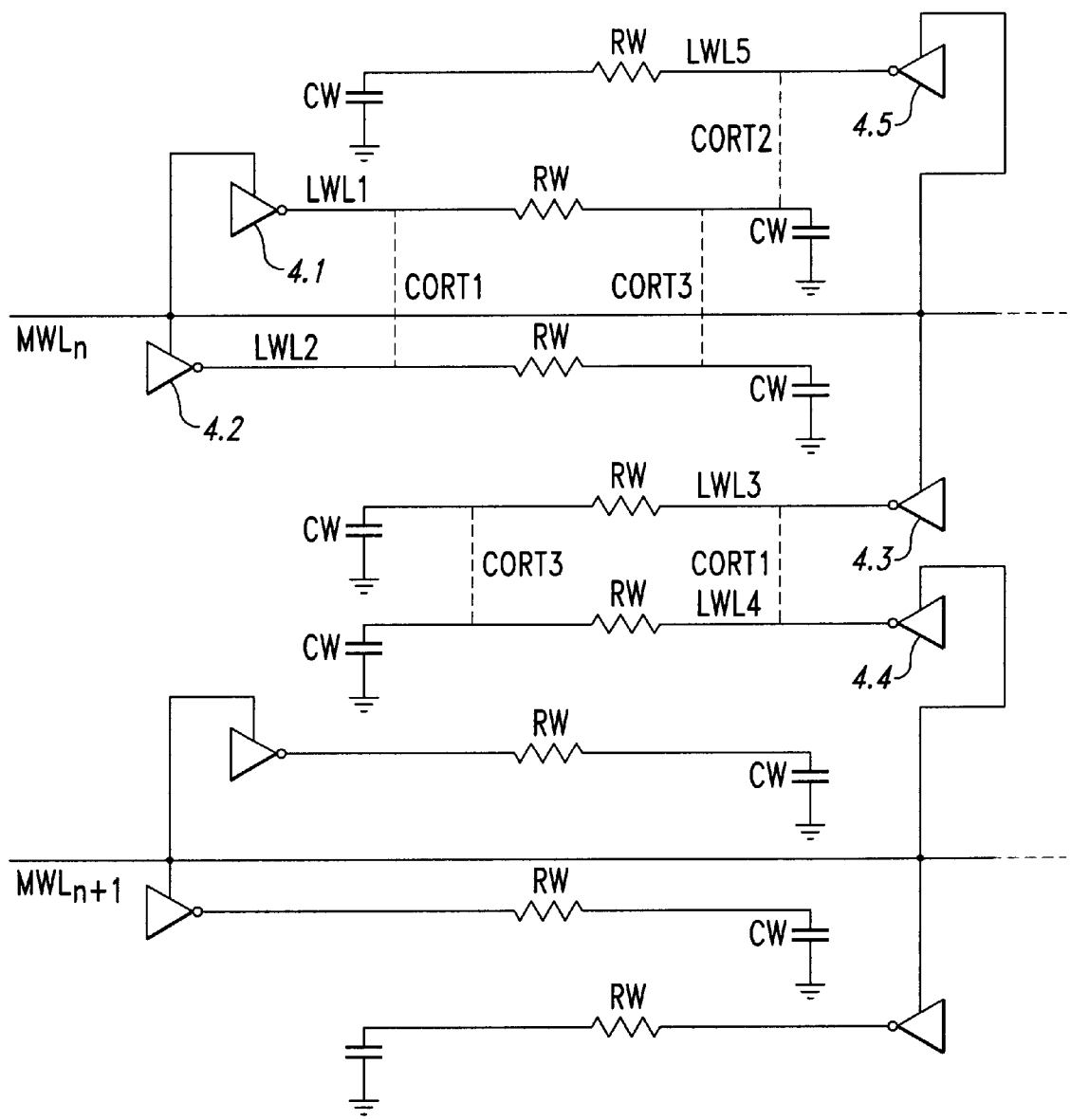
FIG. 2 illustrates some examples of short circuits that may occur between adjacent word lines of a memory device.

Instead, in the case where the word line selected LWL0 is short circuited with an adjacent word line, for example the word line LWL2, the current Iw, once the steady state condition has been attained, is no longer zero, but is determined by the current carried by the NMOS transistor M" belonging to the end inverter connected to the adjacent word line LWL2 short circuited with the selected word line LWL0. In fact, the aforesaid transistor M" is on, in that it must send the adjacent word line LWL2 to ground. In particular, the aforesaid current Iw depends upon the type of existing short circuit (whether resistive or otherwise, as explained previously with reference to FIG. 2).

Figure 4:
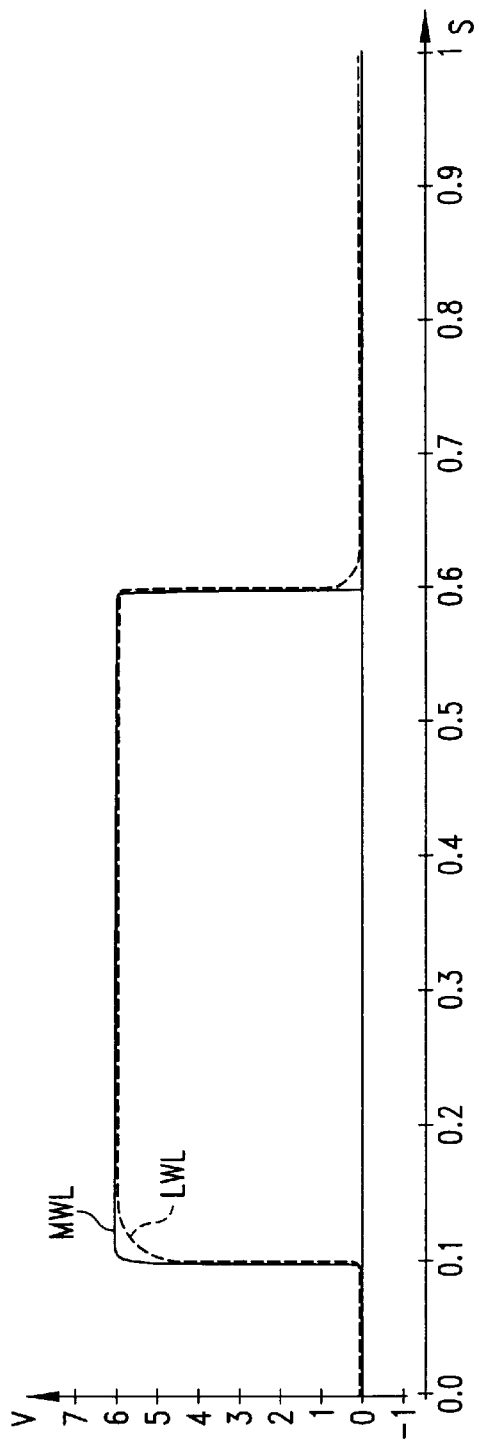
FIGS. 4, 5, 6 and 7 show the plots versus time of electric quantities measured on the device of FIG. 3.
Figure 5:
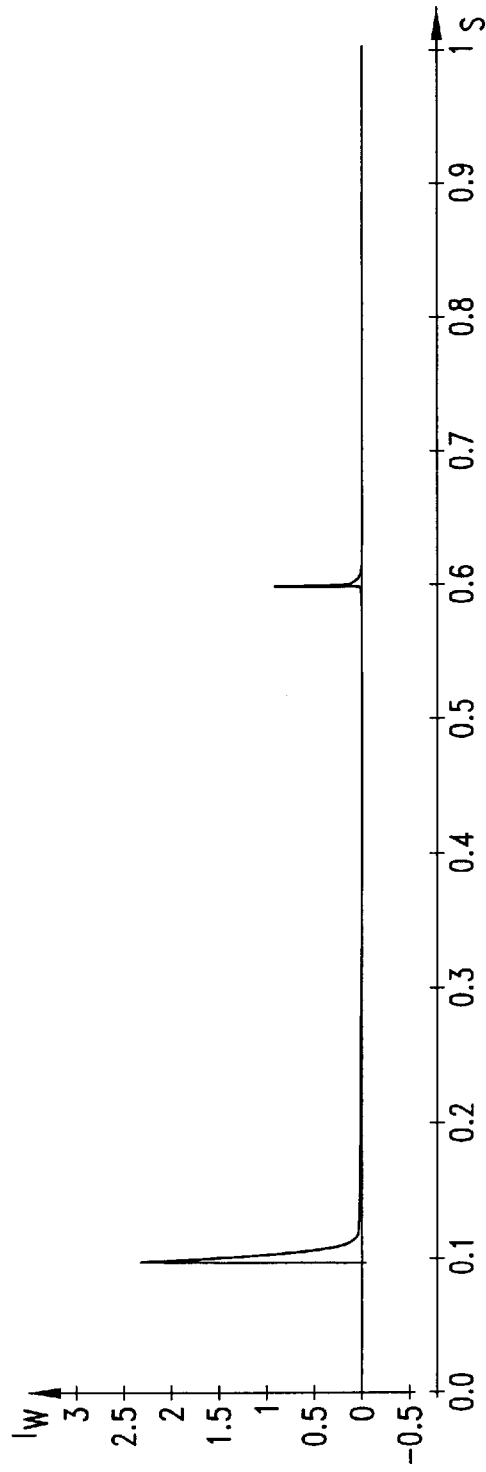

FIGS. 4 and 5 refer to the case where the selected word line LWL0 is not short circuited with one or more adjacent word lines.

More in detail, FIG. 4 shows the plot versus time of the voltage applied to the local word line selected, LWLO, and to the corresponding global word line, MWL0. Note how, during the charge transient of the global word line MWL0 and local word line LWL0, the voltage applied thereto rises until it reaches a preset value once it has settled to the steady state condition.

On the other hand, the biasing current Iw of the local word line selected, LWL0, presents a peak at its charge transient and subsequently drops to its steady state zero value, as shown in FIG. 5.

Figure 6:
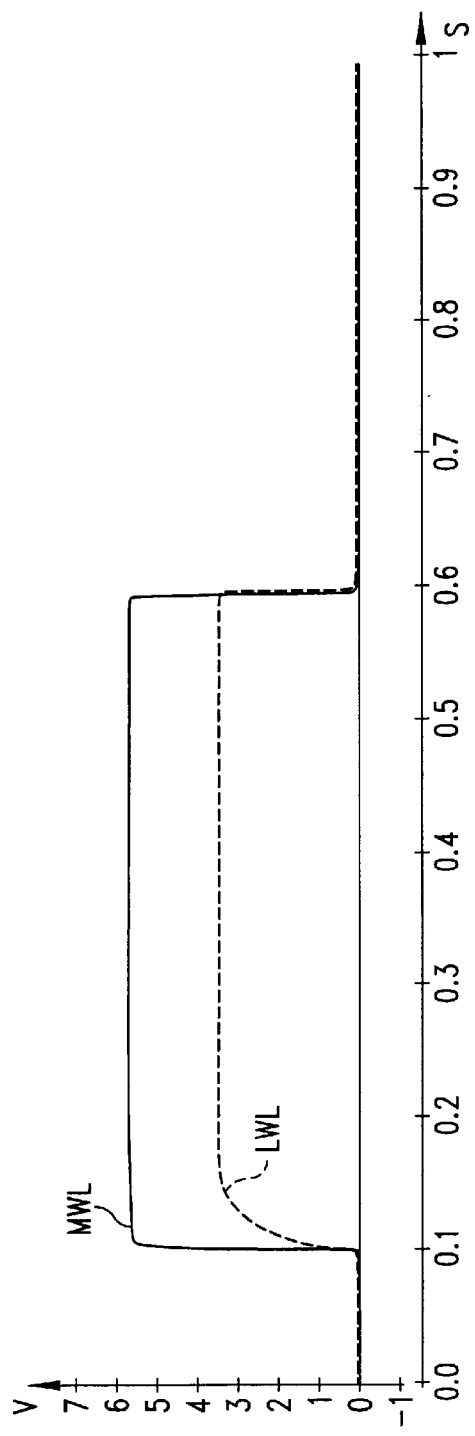
Figure 7:
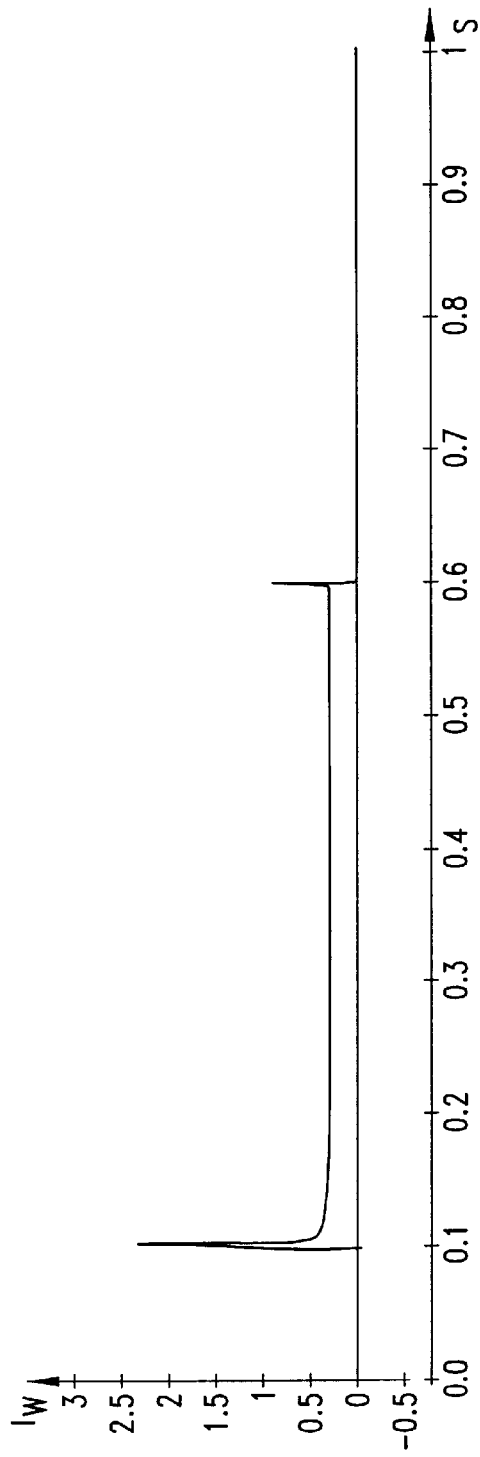

FIGS. 6 and 7 refer to the case where the selected word line LWL0 is short circuited with one or more adjacent word lines, for example with the word line LWL2.

More in detail, FIG. 6 shows the plot versus time of the voltage applied to the selected local word line LWL0 and to the corresponding global word line MWL0. Note how, during the charge transient of the global word line MWL0 and local word line LWL0, the voltage applied thereto rises until it reaches, once it has settled to the steady state condition, a preset value which, for the local word line selected, LWL0, is lower than in the case of the absence of a short circuit.

On the other hand, the biasing current Iw of the local word line selected LWL0 presents a peak at its charge transient and then settles to a non zero steady state value that depends upon the current carried by the NMOS transistor M" belonging to the end inverter connected to the adjacent word line LWL2 short circuited with the selected word line LWL0.

Meanwhile, the output transistor M1 of the voltage regulator REG, on account of its reduced size, is no longer able to absorb an amount of current sufficient to reduce the level of the regulated voltage Vr; for this reason, it is not possible to detect the presence or absence of a short circuit between two or more adjacent word lines by carrying out an investigation based solely upon a check of the value of the regulated voltage Vr.

On the other hand, provided that the time necessary for the transient due to the charge of the parasitic capacitance Cw associated to the selected word line LWL0 to disappear is allowed to elapse, the presence of short circuits between word lines can be detected on the basis of the value of the current IM1 flowing through the transistor M1 minus the constant value Ip.

In practice, in the transistor M2 flows a current IM2 which is proportional to the current IM1 according to the ratio between the shape factors (W/L) of the two transistors M2, M1, the gate to source voltages Vgs of these two transistors being the same.

Consequently, the currents IM1 and IM2 are equal to $$IM1 = Ip + Iw \quad (1)$$

$$IM2 = IM1/k \quad (2)$$

whence $$IM2 = (Ip + Iw)/k$$

The current IM2 is mirrored by means of the first current mirror circuit 21 and brought onto the first circuit node 22.

The second circuit node 23 is instead traversed by the reference current Iref The second current mirror circuit 12 carries out the conversion of the currents IM2 and Iref into the corresponding voltage values that are then compared by the comparison element 14. The voltage digital signal Vo present on the output terminal 16 of the comparison element 14 thus indicates which of the two currents is the greater.

Setting the value of the reference current Iref at $$Iref = (Ip + Iw/2)/k \quad (3)$$

i.e., halfway between the two current values that are possible once the steady state condition is attained, namely IM1=IM1'=Ip, with Iw=0 in the case of a non short circuited word line and IM1=IM1"=Ip+Iw in the case of a short circuited word line, the inputs of the comparison element 14 are never equal.

In this way, provided that care is taken to size the comparison element 14 so that it is sufficiently sensitive, the output of this element is never undetermined, but always indicates the short circuited or non short circuited state of the word line selected LWL0.

More in particular, the voltage digital signal Vo assumes a first logic level if IM1=IM1' and a second logic level if IM1=IM1".

In conclusion, the memory device 1 described herein presents the following advantages:

since it integrates in one and the same chip both the memory array and the short circuit detector, in the testing phase it is possible to read directly, on one of its output pins, the state of any of the word lines in order to establish whether a short circuit has or has not occurred, without having to resort to the use of the algorithm referred to previously;

again in the testing phase, it is no longer necessary to perform any operation of writing the cells and erasing them at the end of the write operation.

All this means a considerable saving in terms of both time and costs in the phase of testing of the memory device.

Finally, it is clear that numerous modifications and variations may be made to the memory device described and illustrated herein, all of which fall within the scope of the invention as specified in the attached claims. In particular, the aforesaid memory device may be either of the bi-level type or of the multilevel type, and may operate advantageously irrespective of whether the regulated voltage Vr generated by the voltage regulator REG is constant or variable, for example linearly increasing. In addition, although the invention has been described with particular reference to the detection of short circuits between local word lines, it is equally applicable for the detection of short circuits between global word lines, or generic word lines, in the case of memories that are not organized hierarchically, i.e., memories in which a single word line decoder is present. Furthermore, even though the invention has been described with particular reference to the case where the output transistor M1 of the voltage regulator REG is of the PMOS type, it is equally applicable to any voltage regulator comprising an output transistor that is traversed by a current correlated with the dynamic current due to the charge of the word line selected (100).

What is claimed is:

1. A nonvolatile memory device comprising an array of memory cells having gate terminals connected to word lines, said word lines being parallel to one another and comprising at least one selected word line connected to an output node of a voltage generating circuit, said output node being traversed by a first current correlated to a biasing current of the memory cells, wherein it comprises a short circuit detecting circuit for receiving a signal correlated to said first current and having an output terminal issuing a short circuit signal which has a first level in the absence of a short circuit and a second level in the presence of a short circuit.

2. The memory device according to claim 1, wherein said first current assumes, once it reaches a steady state condition, a first value corresponding to a normal condition of said selected word line and a second value corresponding to a condition of short circuit of said selected word line with one or more adjacent word lines, and in that said short circuit detecting circuit comprises generating means for generating a first level of said short circuit signal if said first current has a value equal to said first value, and a second level of said short circuit signal if said first current has a value equal to said second value.

3. The memory device according to claim 2, wherein the said second value of said first current may vary in relation to the degree of resistivity of said condition of short circuit.

4. The memory device according to claim 1, wherein said short circuit detecting circuit comprises:

a current sensor element detecting said first current and generating a second current proportional to said first current;

a comparison element having a first input terminal receiving said second current, a second input terminal receiving a reference signal, and an output terminal connected with the output terminal of said short circuit detecting circuit.

5. The memory device according to claim 4, wherein said voltage generating circuit comprises an output transistor of a first type having a control terminal and a conduction terminal connected to said output node, and in that said current sensing element has an input terminal connected to said control terminal of said output transistor and an output terminal connected to said first input terminal of said comparison element.

6. The memory device according to claim 5, wherein said output transistor and sensing transistor are of the PMOS type, in that said first current mirror circuit is made up of NMOS transistors, and said second current mirror circuit is made up of PMOS transistors.

7. The memory device according to claim 4, wherein said current sensing element comprises a sensing transistor of said first type, said sensing transistor having a control terminal connected to the control terminal of said output transistor, a first conduction terminal connected to a first supply line, and a second conduction terminal coupled to said first input terminal of said comparison element via a first current mirror circuit.

8. The memory device according to claim 4, wherein said short circuit detecting circuit further comprises a current to voltage converter circuit connected between a second supply line and said first and second input terminals of said comparison element, said current to voltage converter circuit including a second current mirror circuit.

9. The memory device according to claim 4, wherein said comparison element comprises a voltage comparator circuit having a non inverting input terminal, an inverting input terminal, and an output terminal connected, respectively, with said first input terminal, said second input terminal, and said output terminal of said comparison element.

10. The memory device according to claim 4, wherein said short circuit detecting circuit further comprises a reference current generator which is connected to said second input terminal of said comparison element and generates said reference current, said reference current having a value intermediate between said first value and said second value of said first current.

11. The memory device according to claim 1, wherein said array of memory cells, said voltage generating circuit, and said short circuit detecting circuit are integrated in one and the same chip.

12. Method for the detection of a short circuit condition between word lines in a non-volatile memory device, comprising:

detecting the biasing current on a given word line of said memory device;

comparing said biasing current to a nominal value for said biasing current; and outputting a digital output signal from said second circuit.

13. The method according to claim 12, wherein said second circuit maintains a first condition at said digital output while said biasing current does not exceed said nominal value.

14. The method according to claim 12, wherein said second circuit maintains a second condition at said digital output while said biasing current exceeds said nominal value.

15. Method according to claim 12, wherein a first condition of said digital output signal indicates the absence of a short circuit between said given word line and a second word line.

16. Method according to claim 12, wherein a second condition of said digital output signal indicates the presence of a short circuit between said given word line and a second word line.

17. The method according to claim 12, wherein said first circuit provides a current proportionate to said biasing current.

18. The method according to claim 17, wherein said second circuit compares said proportionate current to said nominal value.

* * * * *